United States Patent
Hung et al.

(10) Patent No.: US 9,368,220 B2
(45) Date of Patent: *Jun. 14, 2016

(54) NON-VOLATILE MEMORY DEVICE AND METHOD FOR SHORTENED ERASE OPERATION DURING TESTING

(71) Applicant: Macronix International Co., Ltd., Hsinchu (TW)

(72) Inventors: Chun-Hsiung Hung, Hsinchu (TW); Kuen-Long Chang, Taipei (TW); Ken-Hui Chen, Hsinchu (TW); Nai-Ping Kuo, Hsinchu (TW); Chin-Hung Chang, Tainan (TW); Chang-Ting Chen, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/451,166

(22) Filed: Aug. 4, 2014

(65) Prior Publication Data

US 2014/0376311 A1    Dec. 25, 2014

Related U.S. Application Data

(63) Continuation of application No. 13/536,555, filed on Jun. 28, 2012, now Pat. No. 8,797,802.

(60) Provisional application No. 61/611,156, filed on Mar. 15, 2012.

(51) Int. Cl.
| | |
|---|---|
| *G11C 16/16* | (2006.01) |
| *G11C 16/14* | (2006.01) |
| *G11C 29/34* | (2006.01) |
| *G11C 16/04* | (2006.01) |
| *G11C 29/26* | (2006.01) |

(52) U.S. Cl.
CPC ............ *G11C 16/16* (2013.01); *G11C 16/0483* (2013.01); *G11C 16/14* (2013.01); *G11C 29/34* (2013.01); *G11C 2029/2602* (2013.01)

(58) Field of Classification Search
CPC .... G11C 16/16; G11C 16/14; G11C 16/0483; G11C 29/34; G11C 2029/2602
See application file for complete search history.

(56) References Cited

U.S. PATENT DOCUMENTS

| | | | |
|---|---|---|---|
| 5,412,793 A | 5/1995 | Kreifels et al. | |
| 6,279,070 B1 * | 8/2001 | Jeong | G11C 16/16 365/185.29 |
| 8,797,802 B2 | 8/2014 | Hung et al. | |
| 2001/0005328 A1 | 6/2001 | Tsunesada | |
| 2002/0101765 A1 * | 8/2002 | Mihnea | G11C 16/14 365/185.33 |
| 2003/0028709 A1 | 2/2003 | Micheloni et al. | |
| 2005/0052908 A1 | 3/2005 | Tomoeda et al. | |
| 2005/0078522 A1 * | 4/2005 | Abedifard | G11C 16/16 365/185.19 |
| 2007/0086251 A1 | 4/2007 | Lutze et al. | |
| 2008/0137409 A1 * | 6/2008 | Nakamura | G11C 16/0483 6/483 |
| 2011/0004726 A1 * | 1/2011 | Haukness | G11C 16/16 711/103 |
| 2012/0044764 A1 * | 2/2012 | Nakai | G11C 16/14 365/185.11 |

* cited by examiner

*Primary Examiner* — Richard Elms
*Assistant Examiner* — Ajay Ojha
(74) *Attorney, Agent, or Firm* — Haynes Beffel & Wolfeld LLP

(57) ABSTRACT

A nonvolatile memory array has a multiple erase procedures of different durations. A block of memory cells of the array can be erased by one of the different erase procedures.

21 Claims, 10 Drawing Sheets

NON-VOLATILE MEMORY DEVICE AND METHOD FOR SHORTENED ERASE OPERATION DURING TESTING

REFERENCE TO RELATED APPLICATION

This application is a continuation of U.S. patent application Ser. No. 13/536,555, filed 28 Jun. 2012 (now U.S. Pat. No. 8,797,802) and claims the benefit of U.S. Provisional Patent Application No. 61/611,156 filed 15 Mar. 2012. Both applications are incorporated herein by reference.

BACKGROUND

Integrated circuits with a nonvolatile memory array have a single erase algorithm to erase a particular block of memory cells. For example, a single erase algorithm is performed, regardless of whether the integrated circuit is undergoing mass production testing, or whether the integrated circuit is with the end user performing normal operations.

SUMMARY

A multi-phase erase procedure can be performed on a nonvolatile memory array of an integrated circuit in one of multiple modes having different durations. An example application of a first erase mode, which has a shorter duration than a second erase mode, is improving mass production testing time. Mass production testing time is improved, because the testing flow can include many erase procedures.

One aspect of the technology described here is an integrated circuit comprising a nonvolatile memory array with memory cells, and control circuitry. The control circuitry performs a multi-phase erase procedure including an erase phase and at least one other phase such as a pre-program phase and a soft program phase. The multi-phase erase procedure has characteristics determined by a particular mode that is one of a first erase mode and a second erase mode. The characteristics of the procedure include a number of phases, and shapes and durations of the pulses applied during the phases. The first erase mode has a shorter duration than the second erase mode, of performing the multi-phase erase procedure on a block of memory cells in the nonvolatile memory array. The multi-phase erase procedure can be performed responsive to an erase command identifying the block of memory cells in the nonvolatile memory array. The shorter duration can be for a particular instance or on average.

In some embodiments of the described technology, the first erase mode excludes a phase that is included in the second erase mode, such as the pre-program phase or the soft program phase. Excluding a phase results a faster erase procedure, though resulting in memory cells that may be over-erased at the conclusion of the erase procedure.

In some embodiments of the described technology, the control circuitry automatically switches repeatedly between the first erase mode and the second erase mode. This mixed mode balances speed of the first erase mode with improved program-erase endurance of the second erase mode from fewer issues with over-erased memory cells. Various embodiments of the described technology are directed to different ratios of first erase procedure performed to second erase procedure performed.

To achieve the shorter duration, various embodiments of the described technology adjust one or more phases in the first erase mode of the multi-phase erase procedure as compared to the second erase mode of the multi-phase erase procedure. In one example, the first erase mode has a shorter pulse duration than the second erase mode in a bias arrangement applied to the nonvolatile memory array. In another example, the first erase mode has a larger magnitude pulse than the second erase mode in a bias arrangement applied to the nonvolatile memory array; the larger magnitude pulse on average completes a given phase faster by faster programming or faster erasing. In yet another example, the first erase mode has a fewer number of pulses than the second erase mode in a bias arrangement applied to the nonvolatile memory array. In a further example, in response to verify failure, the first erase mode has a larger magnitude voltage step change than the second erase mode in a bias arrangement applied to the nonvolatile memory array; the larger magnitude pulse completes a given phase faster on average by faster programming or faster erasing.

In some embodiments of the described technology, the first erase mode is active during testing of the nonvolatile memory array, and the second erase mode is active after testing of the nonvolatile memory array.

Various embodiments of the described technology identify whether the multi-phase erase procedure is in a first erase mode or second erase mode. In some embodiments of the described technology, the erase command has different command codes for the first erase mode and the second erase mode. Some embodiments of the described technology further comprise a memory storing erase mode data read by the control circuitry to determine the particular erase mode of the multi-phase erase procedure.

Another aspect of the technology further described here is a method of erasing memory cells in a nonvolatile memory array, comprising:

receiving an erase command identifying a block of memory cells in the nonvolatile memory array; and responsive to the erase command, performing a multi-phase erase procedure including an erase phase and one or more phases from a pre-program phase and a soft program phase, the multi-phase erase procedure having characteristics determined by a particular mode that is one of a first erase mode and a second erase mode, the first erase mode having a shorter duration on average than the second erase mode of performing the multi-phase erase procedure on the block of memory cells in the nonvolatile memory array.

Various embodiments of the described technology automatically switch repeatedly between the first erase mode and the second erase mode. This mixed mode balances speed of the first erase mode with improved program-erase endurance of the second erase mode from fewer issues with over-erased memory cells. Various embodiments of the described technology are directed to different ratios of first erase procedure performed to second erase procedure performed.

Various embodiments of the described technology select the first erase mode for testing of the nonvolatile memory array; and select the second erase mode for after testing of the nonvolatile memory array.

Various embodiments of the described technology read a memory storing mode data read to determine the particular mode of the multi-phase erase procedure.

Various other embodiments of the described technology are disclosed herein.

In some embodiments of the described technology, the shortened erase is used by the integrated circuit in conjunction with a tester. In other embodiments of the described technology, the shortened erase is used by the integrated circuit without a tester.

Other embodiments of the described technology are disclosed herein.

DETAILED DESCRIPTION

Figure 1:
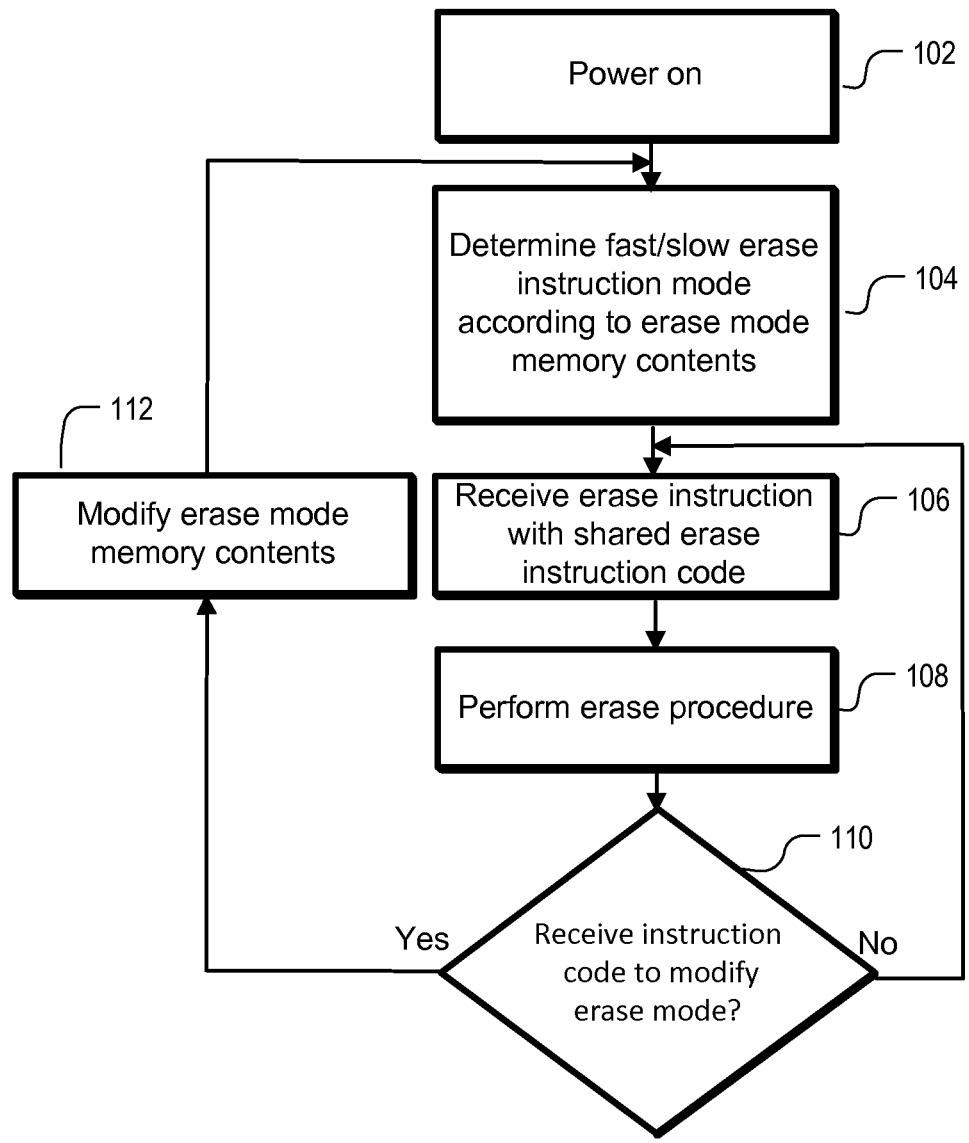
FIG. 1 is an example of a process flow of an erase instruction, which stores the present erase mode (e.g., fast erase mode or slow erase mode) in a memory and performs memory instructions with shared erase instruction codes that are common to the fast erase mode and the slow erase mode.

FIG. 1 is an example of a process flow of an erase instruction, which stores the present erase mode (e.g., fast erase mode or slow erase mode) in a memory and performs memory instructions with shared erase instruction codes that are common to the fast erase mode and the slow erase mode. As used herein, a fast erase mode is fast relative to the slow erase mode, and a slow erase mode is slow relative to the fast erase mode. The erase procedure in the fast erase mode is shorter than the erase procedure in the slow erase mode, on average. In specific erase procedure instances, such as where there is repeated verify failure requiring repeated cycles in some phase of the erase procedure in fast erase mode, and where there is no verify failure in some phase of the erase procedure in slow erase mode, the fast erase mode may actually take longer than the slow erase mode. However, such specific erase procedure instances are atypical, and the erase procedure in the fast erase mode is typically shorter than the erase procedure in the slow erase mode for the same block of memory cells.

In 102, power on occurs. Following power on, in 104, the erase mode memory contents are read, to determine whether erase instructions are performed according to a fast erase mode or a slow erase mode. In some embodiments the contents of the erase mode memory has default contents, in the absence of any instruction to write initial erase mode memory contents or otherwise modify the erase mode memory contents. For example, in some embodiments the erase mode memory has default contents indicating that the multi-phase erase procedure is in a fast erase mode, and in other embodiments the erase mode memory has default contents indicating that the multi-phase erase procedure is in a slow erase mode.

In various embodiments the erase mode memory is a register, fuse, latch, nonvolatile memory, or volatile memory.

In 106, an erase instruction is received with a shared erase instruction code and an erase address or addresses. The shared instruction code is common to the fast erase mode and the slow erase mode. In various embodiments different instruction codes are not required for the fast erase mode and the slow erase mode, because the erase mode memory indicates the fast erase mode or the slow erase mode. The specified address block can be a single address or a range of addresses, such as the whole memory array, a sector or block, or other unit. The erase procedure in the fast erase mode has a shorter duration than in the slow erase mode on average, for a same block of memory cells. For example, the duration of the erase procedure in the fast erase mode for a single sector is compared with the duration of the erase procedure in the fast erase mode for a single sector, and not a different erase block size. The address can be specified as a default address associate with the instruction code. In the case of an instruction code to erase the whole array, the instruction code identifies the whole array. In 108, the erase procedure is performed on the erase address or addresses indicated in the erase instruction.

In 110, if an instruction code to modify the erase mode memory is not received, operation in the same erase mode continues (e.g., fast erase mode or slow erase mode), and the loop continues from 106 again. In 110, if, prior to the next erase instruction, an instruction code to modify the erase mode memory is received, then in 112 the control circuitry correspondingly modifies the erase mode memory contents to indicate a switch in erase mode, and the loop continues from 104 again.

In various embodiments the instruction code may or may not be specific to the destination erase mode. For example, in some embodiments the same instruction code switches the integrated circuit from fast erase mode to slow erase mode and from slow erase mode to fast erase mode, and in other embodiments different instruction codes switch the integrated circuit from fast erase mode to slow erase mode, and from slow erase mode to fast erase mode.

Figure 2:
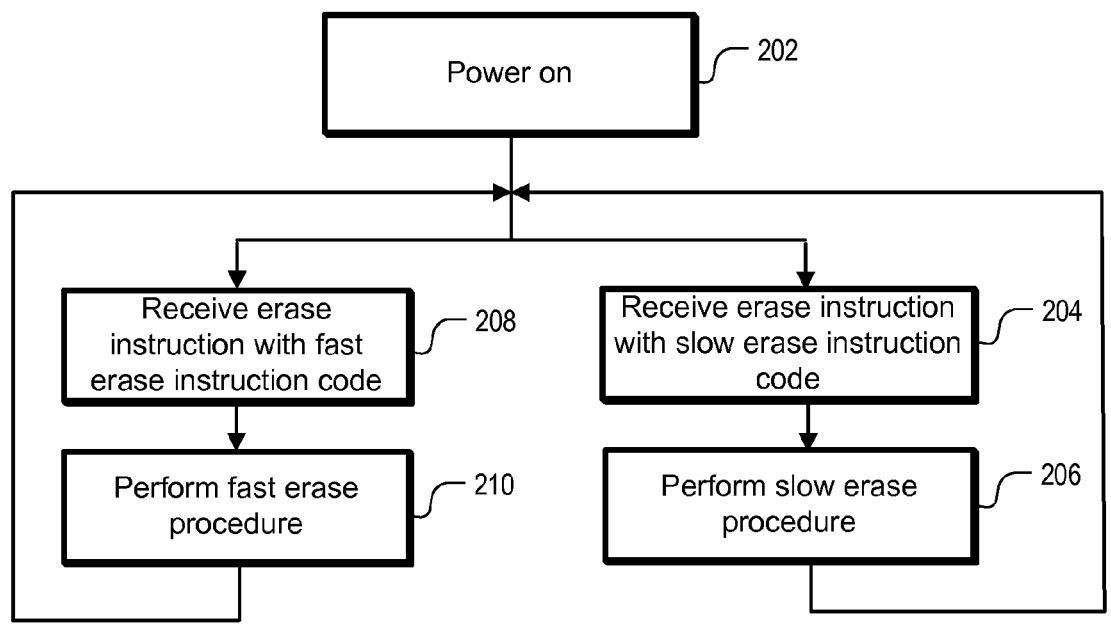
FIG. 2 is an example of a process flow of an erase instruction according to an erase mode (e.g., fast erase mode or slow erase mode) determined by the erase command code of the erase instruction.

FIG. 2 is an example of a process flow of an erase instruction according to an erase mode (e.g., fast erase mode or slow erase mode) determined by the erase command code of the erase instruction. One or more instruction codes are distinct to the slow erase instruction. One or more instruction codes are distinct to the fast erase instruction.

In 202, the integrated circuit powers on. Then, subsequent erase operations depend on whether the erase instruction includes a slow erase instruction code or a fast erase instruction code. In 204, an erase instruction is received including an instruction code for slow erase and an address or addresses. In 206, the slow erase procedure is performed on the address or addresses indicated in the slow erase instruction of 206. In 208, an erase instruction is received including an instruction code for fast erase and an address or addresses. In 210, the fast erase procedure is performed on the address or addresses in the slow erase instruction of 208.

In some embodiments, the input format is compatible with prior erase command syntax. A new command code can be assigned for performing a fast erase operation. For example, "<x><y>h" can be a slow erase command code identical to a legacy command code for erase, and "<a><b>h" can be used as a fast erase command code. The erase command syntax can also specify an address or address range to undergo the erase procedure.

Figure 3:
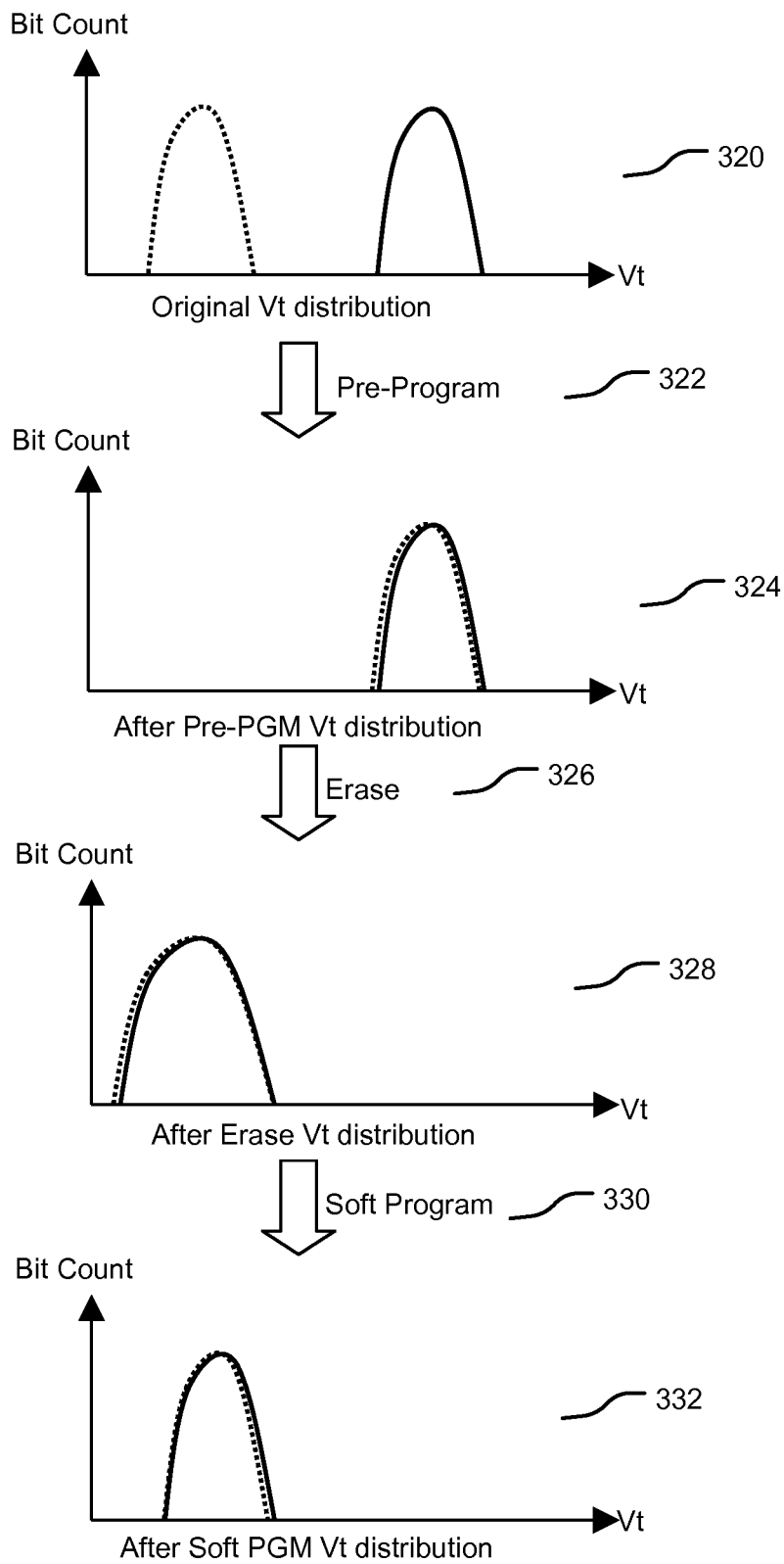
FIG. 3 is an example flow of an erase procedure showing a series of threshold voltage distributions of memory cells at different phases during a multi-phase erase procedure.

FIG. 3 is an example flow of an erase procedure, applicable to both an example fast erase mode and an example slow erase mode, showing a series of threshold voltage distributions of memory cells at different phases during a multi-phase erase procedure. A fast erase mode differs from a slow erase mode, in that one or more of these steps are modified to shorten the average duration of at least one phase in the multi-phase erase procedure.

At 320, two distinct threshold voltage distributions are shown. The memory cells represented by the two distinct threshold voltage distributions can represent, in combination, the threshold voltage distribution of memory cells in an erase group, or block of memory cells undergoing the erase procedure. The dotted line threshold voltage distribution represents memory cells in the group which begin the erase procedure with a low threshold voltage erased state. The solid line threshold voltage distribution represents memory cells in the group which begin the erase procedure with a high threshold voltage programmed state.

At 322, the group of memory cells undergoes the pre-program phase. In the pre-program phase, memory cells represented by the dotted line low threshold voltage distribution are programmed. At 324, two overlapping threshold voltage distributions are shown, which in combination, represent the threshold voltage distribution of memory cells in the erase group. The dotted line threshold voltage distribution, which represents memory cells in the group that began the erase procedure with a low threshold voltage erased state, is programmed. The solid line threshold voltage distribution, which represents memory cells in the group that began the erase procedure with a high threshold voltage programmed state, is unchanged. As a result, both the dotted line and solid line threshold voltage distributions are high threshold voltage distributions.

At 326, the group of memory cells undergoes the erase phase. A result of the erase phase is a widening of the threshold voltage distribution. At 328, two overlapping threshold voltage distributions are shown, which in combination, represent the threshold voltage distribution of memory cells in the erase group. At the conclusion of the pre-program phase at 324, both the dotted line and solid line threshold voltage distributions had high threshold voltage distributions. Following the erase phase, at 328 both the dotted line and solid line threshold voltage distributions have low threshold voltage distributions.

At 330, the group of memory cells undergoes the soft program phase. Soft program is performed on the over-erased cells and low threshold voltages cells. The effect of soft program on the over-erased and low threshold voltages cells, is to tighten the threshold voltage distribution of the group of memory cells. At 332, two overlapping threshold voltage distributions are shown, which in combination, represent the threshold voltage distribution of memory cells in the erase group. At the conclusion of the erase phase at 328, both the dotted line and solid line threshold voltage distributions had undesirably wide, low threshold voltage distributions. Following the soft program phase, at 332 both the dotted line and solid line threshold voltage distributions have narrow, low threshold voltage distributions.

Although the erase procedure as shown in 320-332 has an acceptable threshold voltage distribution of memory cells in the erase group, the erase procedure is time consuming. Accordingly, the erase procedure has multiple modes, including at least one mode with a shorter duration on average than at least one other mode. The total erase procedure duration is the sum of pre-program phase time or duration, erase phase time or duration, and soft program phase time or duration. Each phase of the multi-phase erase procedure has a duration described as follows:

Pre-program time~=Pre-program pulse duration time*pre-program pulse count

Erase time~=Erase pulse duration time*erase pulse count.

Soft program time~=soft program pulse duration time*soft program pulse count

The above equations are a simplification. For example, the multiple pulses in a particular phase may have different durations, such that a single pulse duration time does not accurately describe all pulses. As used herein, a pulse can be a signal having a single constant value, or include a signal having a varying value and/or multiple constant values.

Example mechanisms for erase, pre-program, and soft program, are channel hot electron (CHE) injection, and Fowler-Nordheim (FN) tunneling, substrate hot electron injection (SHEI), source side injection (SSI), and secondary impact ionization initiated channel hot electron injection.

Table 1 is an example of the amount of time taken by different phases of an example erase procedure.

TABLE 1

| Particular Phase During Erase Procedure | Time Ratio (%) |
| --- | --- |
| Pre-Program Phase | ~30 |
| Erase Phase | ~50 |
| Soft Program Phase | ~20 |
|  | 100 |

As shown by Table 1 above, there are different phases which can be shortened to reduce the overall erase procedure duration.

Figure 4:
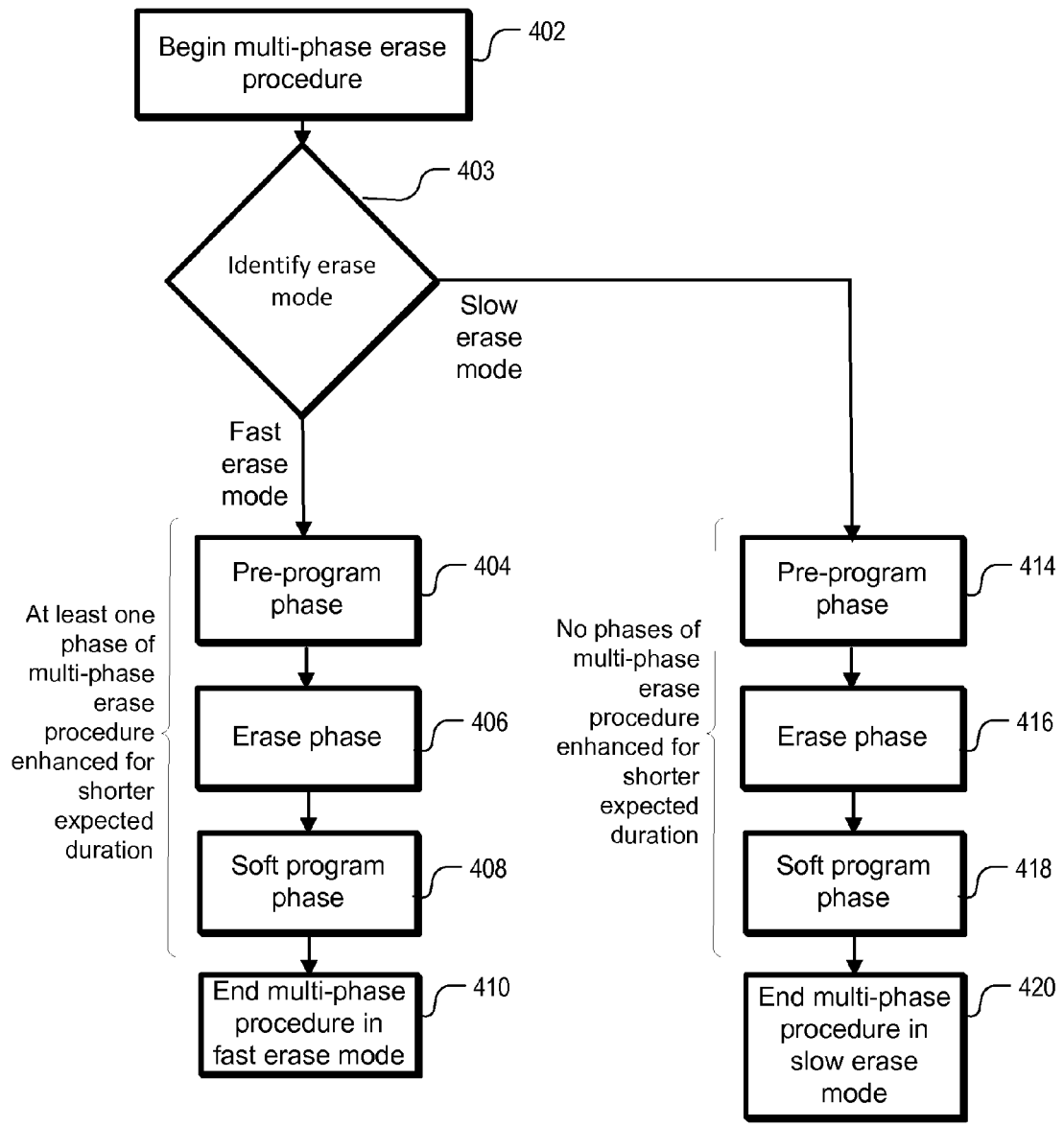
FIG. 4 is an example flowchart of a multi-phase erase procedure, in which the choice of fast erase mode or slow erase mode alters the particular flow of the multi-phase erase procedure.

FIG. 4 is an example flowchart of a multi-phase erase procedure, in which the choice of fast erase mode or slow erase mode alters the particular flow of the multi-phase erase procedure.

The erase command is received by the integrated circuit with the memory array. The erase command identifies an erase group of memory cells to be erased. An erase group can be a contiguous group of memory cells such as a segment, block, or sector, that are collectively erased together in response to an erase command; the erase group also can be a noncontiguous group of memory cells. The erase group of memory cells can be the whole memory array. At 402, the multi-phase erase procedure begins At 403, the erase mode is identified. As discussed in connection with FIGS. 1 and 2, the erase mode can be determined by instruction codes specific to particular erase modes, or by an erase mode memory with contents specific to particular erase modes.

Depending on the outcome of 403, the multi-phase erase procedure follows the fast erase mode 404-410 in which at least one phase of the multi-phase erase procedure is enhanced for a shorter duration on average, or the slow erase mode 414-420 in which no phase of the multi-phase erase procedure is enhanced for a shorter duration on average.

The fast erase mode differs from the slow erase mode, in that the fast erase mode includes one or more duration enhancements in one or more phases. Various fast erase mode enhancements to the slow erase mode are discussed in connection with FIG. 7. However, the following discussion applies to slow erase mode and fast erase mode.

In applying the pre-program pulse(s) in the pre-program phase 404 or 414, the erase procedure applies a particular magnitude voltage of pre-program pulse, having a particular pre-program pulse width duration to erased cells. An optional pre-program verify can repeat pre-program until memory cells in an erase group, such as an erase sector, are sufficiently pre-programmed.

In applying the erase pulse(s) in the erase phase 406 or 416, the erase procedure applies a particular magnitude voltage of erase pulse, having a particular erase pulse width duration to the cells in the erase group, such as an erase sector. In response to erase verify failure, the erase pulse(s) can use voltage stepping, time stepping, or a combination. In "voltage stepping" the magnitude of the voltage level of a series of erase pulses successively applied to the cells in the erase group being erased, is increased for each successive erase until the erase group passes the erase verify process. In "time stepping", the pulse width of subsequent erase pulses is larger than that of the previous erase pulse. Erase is performed successively until the erase group passes erase verify. The pulse width, of a series of erase pulses applied to the cells being erased, is increased for each successive erase, until the sector passes erase verify.

In applying the soft program pulse(s) in the soft program phase 408 or 418, the erase procedure applies a particular magnitude voltage of soft program pulse, having a particular soft program pulse width duration to over-erased cells. An optional soft program verify can repeat soft program until memory cells in an erase group are sufficiently soft programmed.

Figure 5:
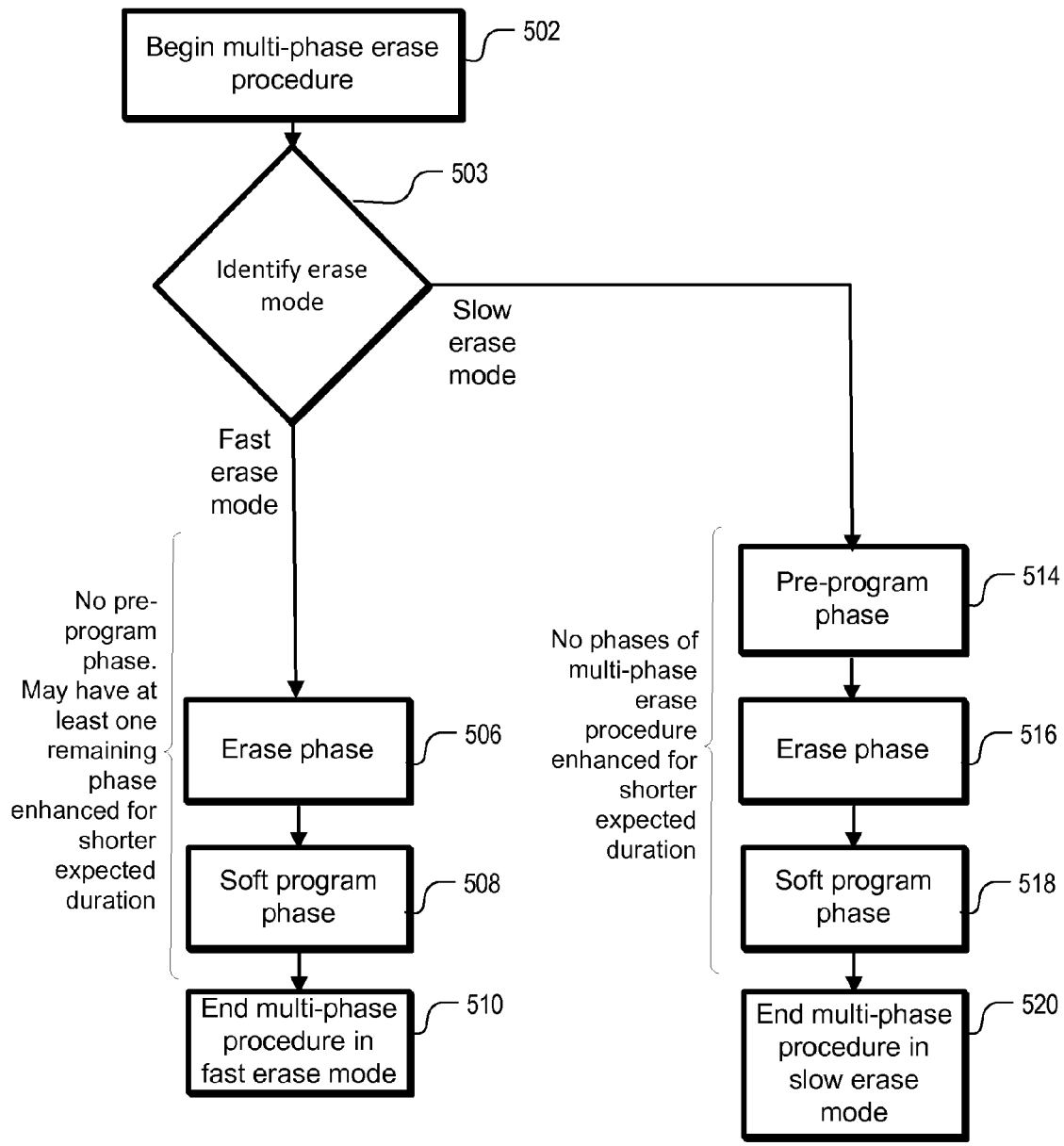
FIG. 5 is an example flowchart of a multi-phase erase procedure, in which the choice of fast erase mode or slow erase mode determines whether to perform the pre-program phase, and alters the particular flow of the other phases of the multi-phase erase procedure.

FIG. 5 is an example flowchart of a multi-phase erase procedure, in which the choice of fast erase mode or slow erase mode determines whether to perform the pre-program phase, and alters the particular flow of the other phases of the multi-phase erase procedure. In contrast with FIG. 4, the pre-program phase is deleted from the fast erase mode flow.

As in FIG. 4, an erase is received. At 502, the multi-phase erase procedure begins. At 503, the erase mode is identified. As discussed in connection with FIGS. 1 and 2, the erase mode can be determined by instruction codes specific to particular erase modes, or by an erase mode memory with contents specific to particular erase modes.

Depending on the outcome of 503, the multi-phase erase procedure follows the fast erase mode 506-510 in which at least one phase of the multi-phase erase procedure is enhanced for a shorter duration on average, or the slow erase mode 514-520 in which no phase of the multi-phase erase procedure is enhanced for a shorter duration on average. The only enhancement in the fast erase mode 506-510 may be the lack of a pre-program phase that is included in the slow erase mode 514-520. Optionally, the fast erase mode 506-510 may include one or more additional enhancements, such as those discussed in connection with FIG. 7.

Figure 6:
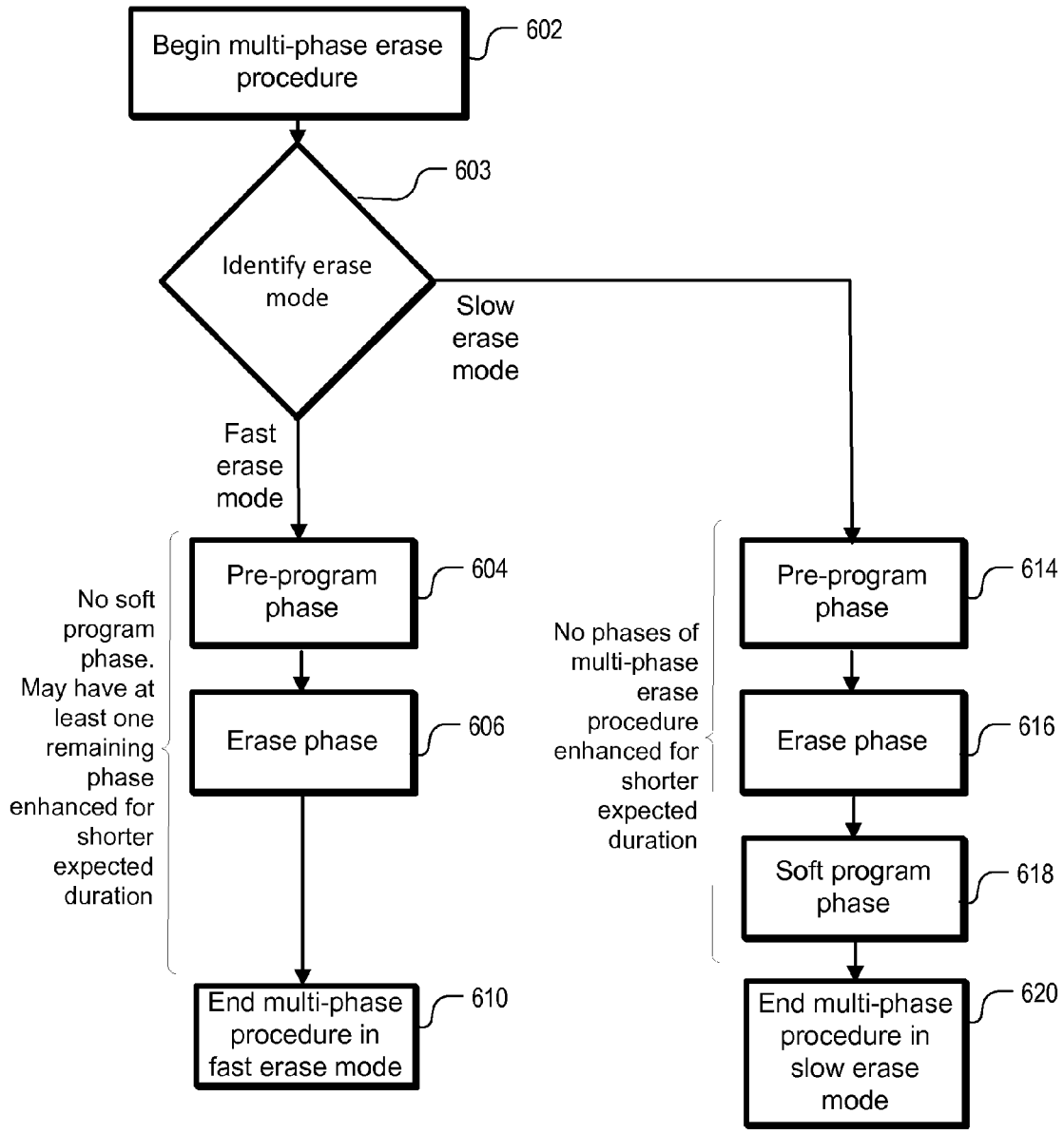
FIG. 6 is an example flowchart of a multi-phase erase procedure, in which the choice of fast erase mode or slow erase mode determines whether to perform the soft program phase, and alters the particular flow of the other phases of the multi-phase erase procedure.

FIG. 6 is an example flowchart of a multi-phase erase procedure, in which the choice of fast erase mode or slow erase mode determines whether to perform the soft program phase, and alters the particular flow of the other phases of the multi-phase erase procedure. In contrast with FIG. 4, the pre-program phase is deleted from the fast erase mode flow.

As in FIG. 4, an erase is received. At 602, the multi-phase erase procedure begins. At 603, the erase mode is identified. As discussed in connection with FIGS. 1 and 2, the erase mode can be determined by instruction codes specific to particular erase modes, or by an erase mode memory with contents specific to particular erase modes.

Depending on the outcome of 603, the multi-phase erase procedure follows the fast erase mode 604-610 in which at least one phase of the multi-phase erase procedure is enhanced for a shorter duration on average, or the slow erase mode 614-620 in which no phase of the multi-phase erase procedure is enhanced for a shorter duration on average. The only enhancement in the fast erase mode 604-610 may be the lack of a soft program phase that is included in the slow erase mode 614-620. Optionally, the fast erase mode 506-510 may include one or more additional enhancements, such as those discussed in connection with FIG. 7.

Figure 7:
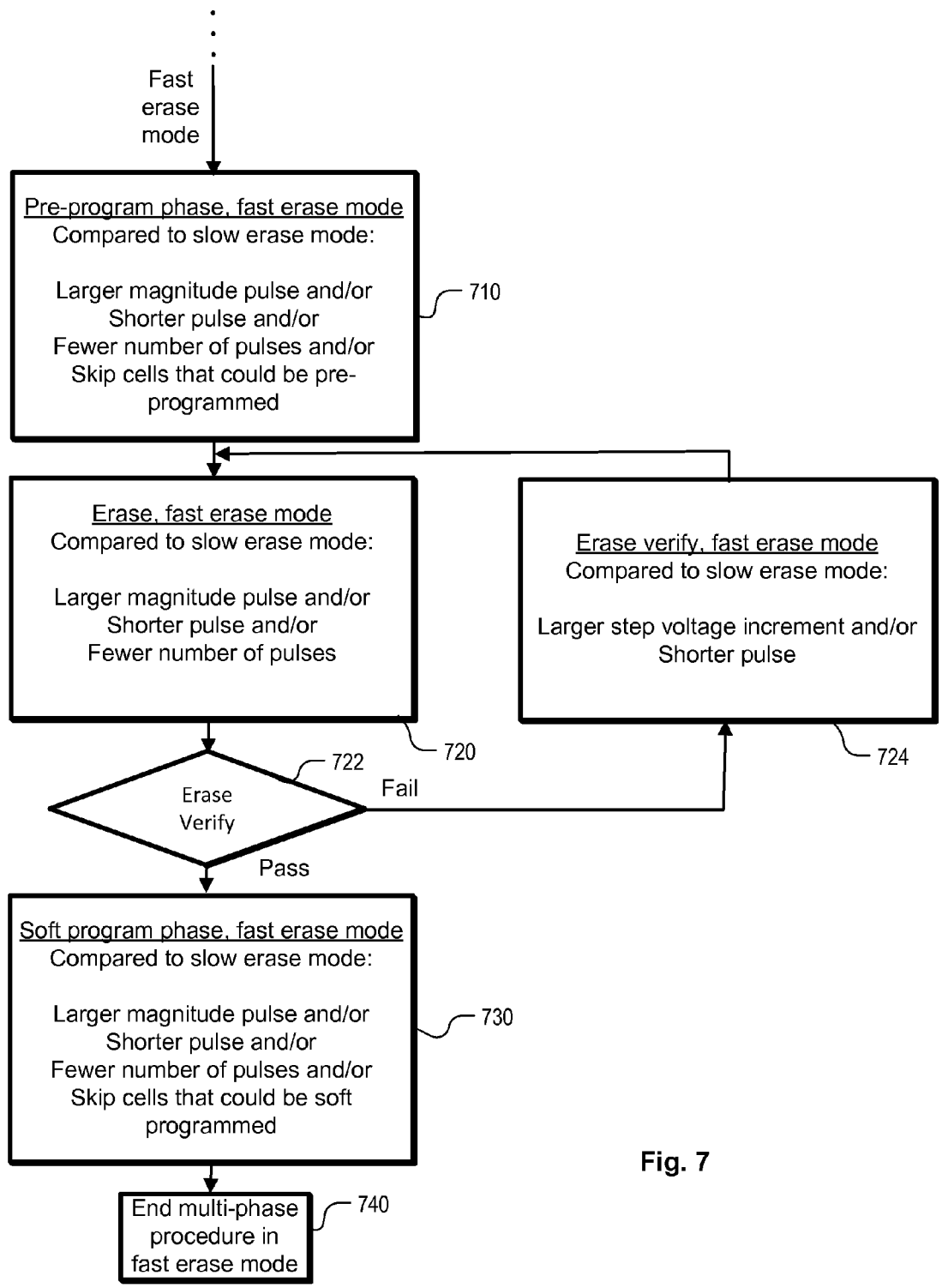
FIG. 7 is an example flowchart of a multi-phase erase procedure in the fast erase mode, in which at least one phase is modified compared to the slow erase mode, to reduce the average duration of the multi-phase erase procedure.

FIG. 7 is an example flowchart of a multi-phase erase procedure in the fast erase mode, in which at least one phase is modified compared to the slow erase mode, to reduce the average duration of the multi-phase erase procedure. The fast erase mode flowchart is an example of a fast erase mode which can appear in, for example, FIG. 4-6.

In the multi-phase erase procedure of 710-740, various fast erase mode enhancements to the slow erase mode include:

A. Pre-Program Phase at 710
  (i) Larger magnitude voltage of pre-program pulse. For example, the drain voltage Vd is increased by 0.2-0.5V or by up to about 10%. In another example, the gate voltage Vg is increased by 1-2V or by up to about 10%. An example total drain voltage Vd range is about 3.5-5.5V. An example total gate voltage Vg range is about 8-11V.
  (ii) Shortened pre-program pulse width duration. For example, the duration is reduced by up to about 1 us or by up to about 50%. An example total pulse duration range is about 1.5-3 us.
  (iii) Fewer pre-program pulses. For example 1 pulse is applied or the maximum number of retry pulses is reduced, such as by half to 8 to 16 pulses. An example range of the number of pulses is 8-32 pulses.
  (iv) Partial pre-program—partially program one or more particular erased cells, and/or skip rather than program one or more particular erased cells.
  (v) Skipped pre-program B. Erase at 720 (Together with Erase Verify at 722 and 724, Comprising Erase Phase)
  (i) Larger magnitude voltage of erase pulse. For example, the body voltage Vb is increased by about 1V or by about 10-20%. In another example, the gate voltage Vg is decreased by up to about 1V or by up to about 10%. An example total body voltage Vb range is about 4-10V. An example total gate voltage Vg range is about −6 to −9V.
  (ii) Shortened erase pulse width duration. For example, the duration is reduced by about 1 ms or up to about 20%. An example total pulse duration range is about 0.1-10 ms.
  (iii) Larger magnitude of erase voltage step increasing the erase pulse magnitude voltage, if erase verify fails. For example, the erase voltage step of 0.2V is increased to 0.4V or 0.8V. An example total erase voltage range is about 4-10V. An example range of the erase voltage step is about 0.1-1V.
  (iv) Shortened erase pulse width duration, if erase verify fails. For example, the duration is reduced by up to about 1 ms or by up to about 20%. An example total pulse duration range is about 0.1-10 ms.

C. Soft Program Phase at 730

(i) Larger magnitude soft program pulse. For example, the drain voltage Vd is increased by 0.2-0.5V or by up to about 10%. In another example, the gate voltage Vg is increased by 0.5-1V or by up to about 20%. An example total drain voltage Vd range is about 3-5V. An example total gate voltage Vg range is about 2-6V.

(ii) Shortened soft program pulse width duration. For example, the duration is reduced by up to about 10 us or by up to about 50%. An example total pulse duration range is about 32-256 us.

(iii) Fewer soft program pulses. For example 1 pulse is applied or the maximum number of retry pulses is reduced, such as by half to 4 to 8 retry pulses. An example range of the number of pulses is 4-16 pulses.

(iv) Partial soft program—partially program one or more particular over-erased cells, and/or skip rather than program particular over-erased cells.

(v) Skipped soft program.

Various embodiments are directed to different combinations of the listed fast erase procedure enhancements to a slow erase procedure. In some embodiments, a particular combination of fast erase procedure enhancements is selectable by configuring a nonvolatile or volatile memory.

Figure 8:
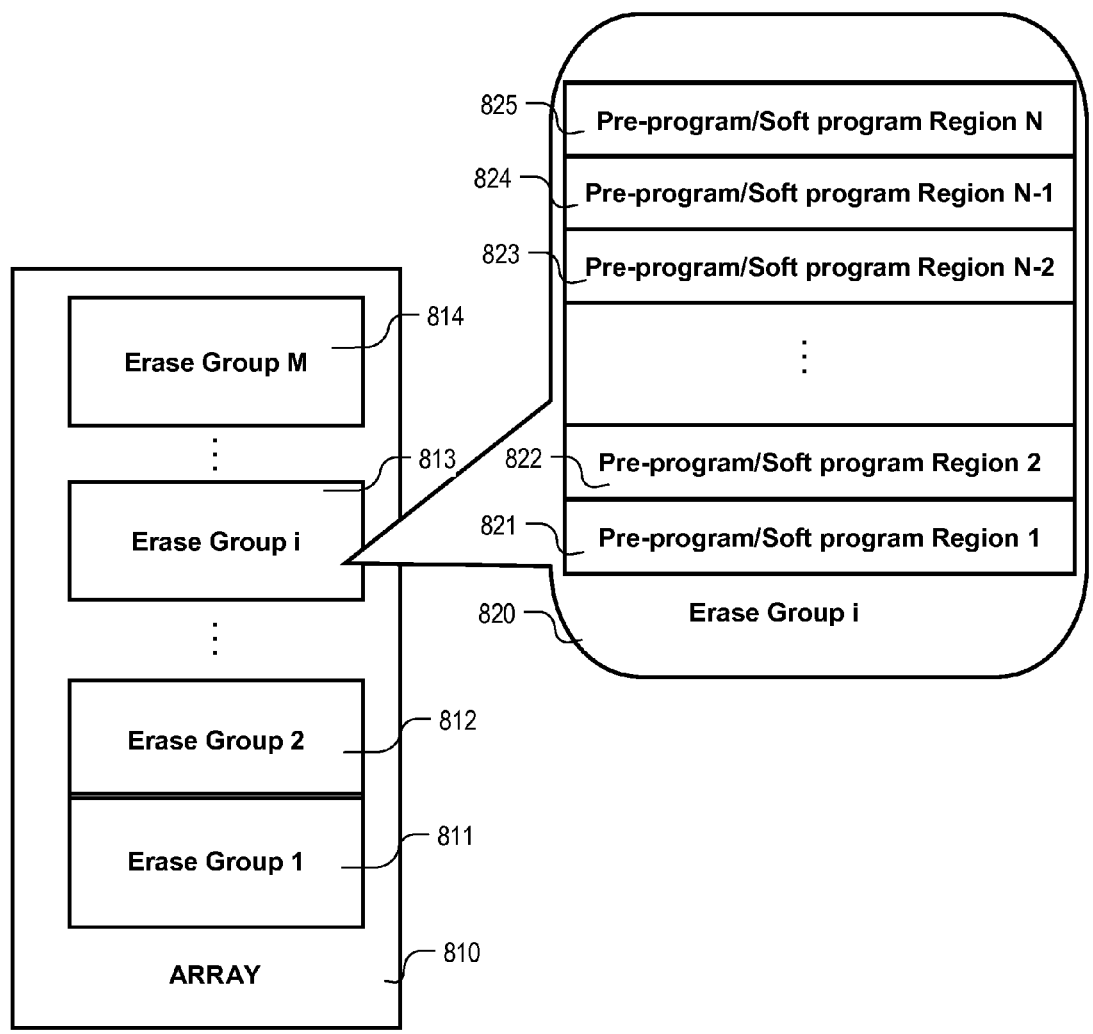
FIG. 8 is a block diagram of a memory cell, showing the division of a memory array into multiple erase groups, and the division of an erase group into multiple pre-program and/or soft program regions.

FIG. 8 is a block diagram of a memory cell, showing the division of a memory array into multiple erase groups, and the division of an erase group into multiple pre-program and/or soft program regions.

The memory array 810 is divided into multiple erase groups 1 811, 2 812, . . . , i 813, . . . , M 814. An erase group can be a contiguous group of memory cells such as a segment, block, or sector, that are collectively erased together in response to an erase command; the erase group also can be a noncontiguous group of memory cells. The erase group of memory cells can be the whole memory array, in response to an erase command to erase the whole memory array.

The erase groups are further divided into multiple pre-program and/or soft program regions. Erase group i 813 (shown in expanded view of erase group i 820) is divided into pre-program and/or soft program regions 1 821, 2 822, . . . , N−2 823, N−1 824, N 825. With the division of an erase group into multiple pre-program and/or soft program groups, pre-program and/or soft program can be performed on part of an erase group instead of the entire erase group. Over multiple erase procedures, a different pre-program and/or soft program region can be selected for pre-program and/or soft program during each subsequent erase procedure. In some embodiments, the pre-program groups are different from the soft program groups. In other embodiments, the pre-program groups are the same as the soft program groups.

Selective pre-program and/or soft program is performed on the erase group of memory cells identified to be erased. The pre-program and/or soft program is selective in that the pre-program and/or soft program is performed on only part of the erase group of memory cells. As shown in FIG. 8, the erase group is divided into multiple pre-program and/or soft program regions. The pre-program and/or soft program is performed on memory cells in at least one particular pre-program and/or soft program region. Such selective pre-program and/or soft program is different from a full pre-program and/or soft program, in which all memory cells in the erase group which are already in the erased state are pre-programmed, or all memory cells in the erase group which are over-erased are soft programmed.

In some embodiments, in selective pre-program and/or soft program, memory cells which are already in the erased state must be in a particular pre-program and/or soft program region of the erase group, in order to undergo pre-program and/or soft program.

Because pre-program and/or soft program is performed on only part of the erase group of memory cells, pre-program and/or soft program is faster than if performed on the entire erase group of memory cells.

In some embodiments, if the erase procedure is the first erase procedure performed after power on, then a pre-program and/or soft program region is arbitrarily selected out of the erase group. If the erase procedure is the second or subsequent erase procedure performed after power on, then the next pre-program and/or soft program region is selected out of a sequence of pre-program and/or soft program regions of the erase group.

Figure 9:
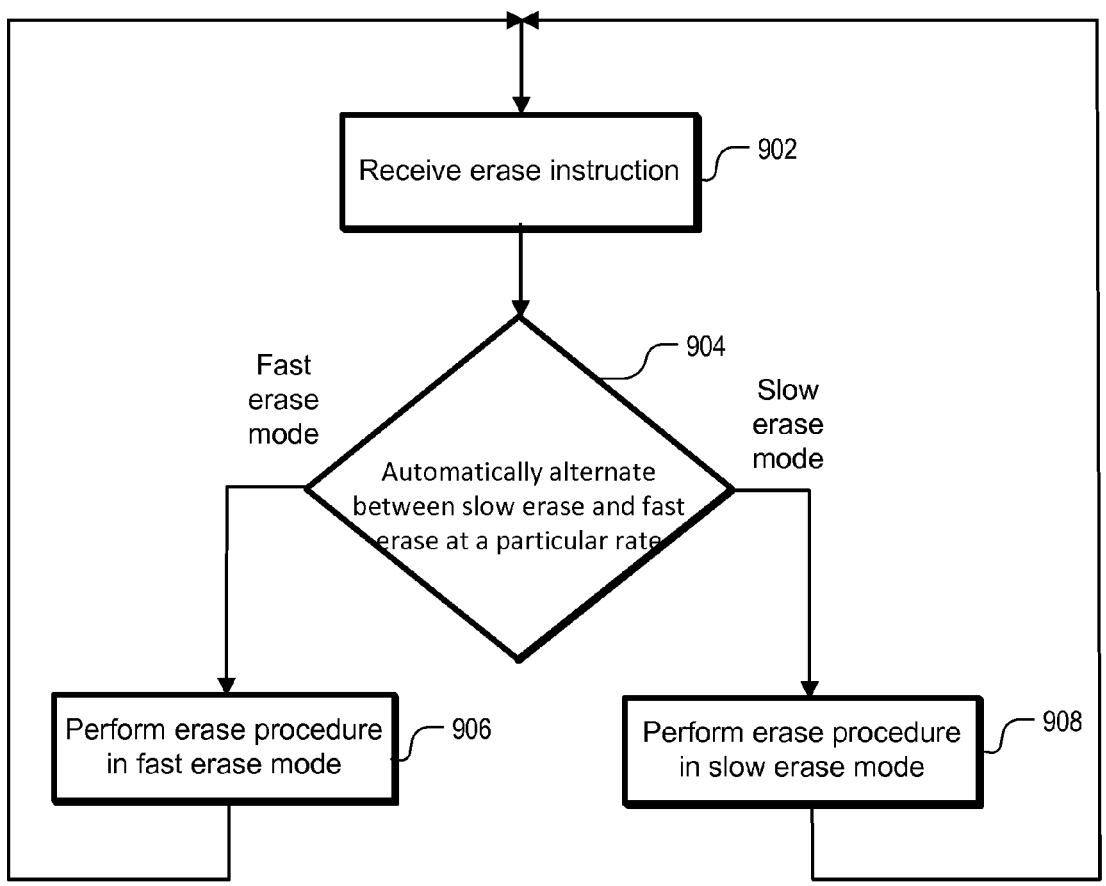
FIG. 9 is an example flowchart of a multi-phase erase procedure, in which the multi-phase erase procedure alternates automatically between a fast erase mode and slow erase mode at a particular rate.

FIG. 9 is an example flowchart of a multi-phase erase procedure, in which the multi-phase erase procedure alternates automatically between a fast erase mode and slow erase mode at a particular rate.

At 902, an erase instruction is received including, for example, an instruction code for erase and an address or addresses. As discussed in FIGS. 1 and 2, the instruction code may be shared or distinct between fast erase mode and slow erase mode of the multi-phase erase procedure.

At 904, the fast erase operation and the slow erase operation is chosen. The fast erase operation and the slow erase operation are alternated automatically. Such alternation can occur when erasing a same memory cell, in response to a single erase command or different erase commands. Depending on the result of 904, the fast erase mode is chosen and at 906 the multi-phase erase procedure is performed in fast erase mode, or the slow erase mode is chosen and at 908 the multi-phase erase procedure is performed in fast erase mode.

This mixed mode of automatically alternating between fast erase mode and slow erase mode, balances speed of the fast erase mode with improved program-erase endurance of the slow erase mode from fewer issues with over-erased memory cells. Various embodiments of the described technology are directed to different ratios of fast erase mode performed to slow erase mode performed.

Figure 10:
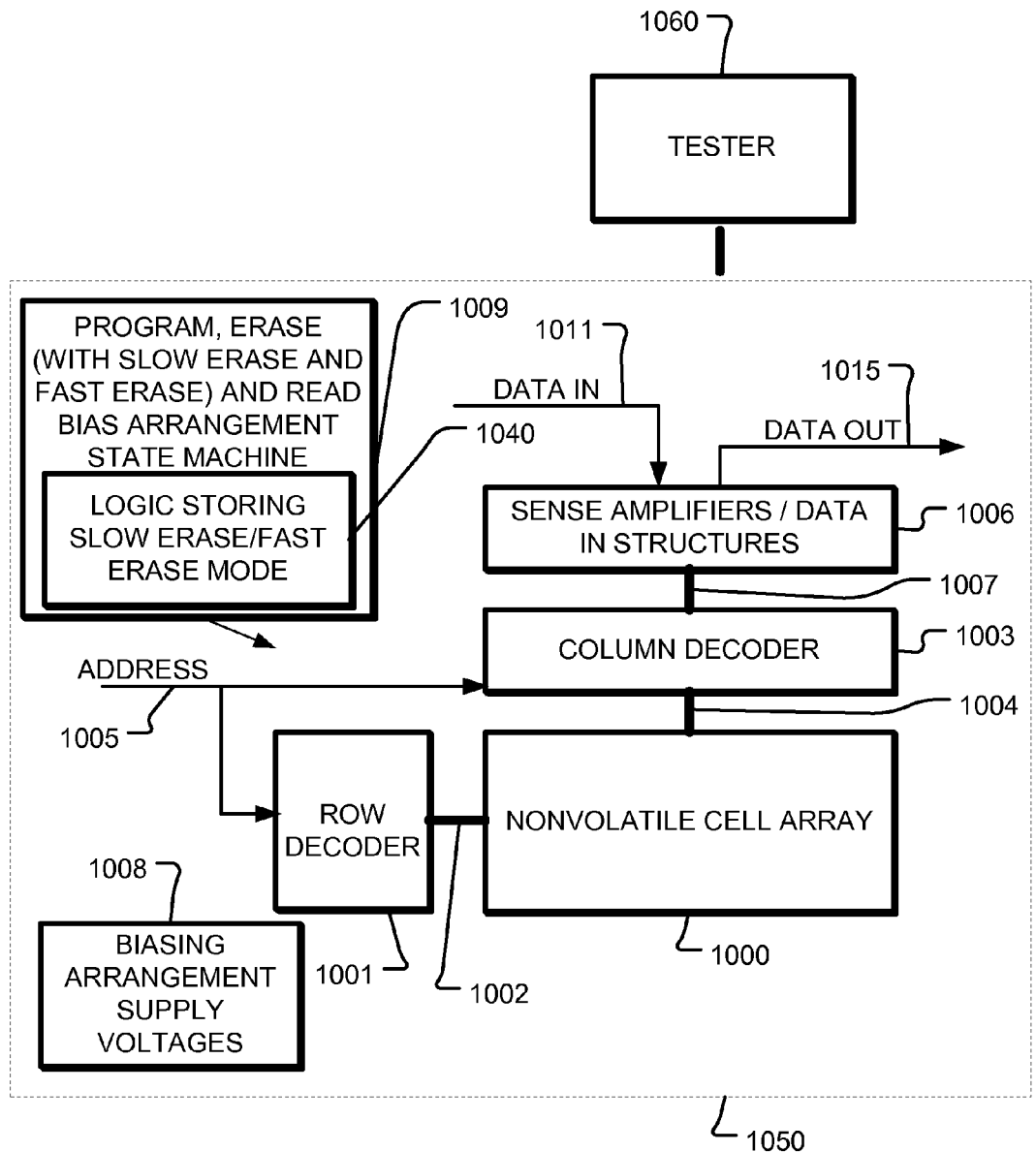
FIG. 10 is a block diagram of an integrated circuit with a memory array and improvements described herein.

FIG. 10 is a block diagram of an integrated circuit with a memory array and improvements described herein. An integrated circuit 1050 includes a memory array 1000. A word line (or row) and block select decoder 1001 is coupled to, and in electrical communication with, a plurality of word lines 1002, and arranged along rows in the memory array 1000. A bit line (column) decoder and drivers 1003 are coupled to and in electrical communication with a plurality of bit lines 1004 arranged along columns in the memory array 1000 for reading data from, and writing data to, the memory cells in the memory array 1000. Addresses are supplied on bus 1005 to the word line decoder and drivers 1008 and to the bit line decoder 1003. Sense amplifiers and data-in structures in block 1006, are coupled to the bit line decoder 1003 via the bus 1007. Data is supplied via the data-in line 1011 from input/output ports on the integrated circuit 1050, to the data-in structures in block 1006. Data is supplied via the data-out line 1015 from the sense amplifiers in block 1006 to input/output ports on the integrated circuit 1050, or to other data destinations internal or external to the integrated circuit 1050. Program, erase, and read bias arrangement state machine circuitry 1009 controls biasing arrangement supply voltages 1008, and performs fast erase and slow erase. State machine circuitry 1009 also includes memory 1040 that stores data indicating a fast erase or slow erase mode. Memory 1040 can be a nonvolatile memory, counter, or other memory in control circuitry.

A tester 1060 in communication with the integrated circuit 1050 uses the fast erase for the memory array 1000, as described herein.

One programmed state is shown, but other embodiments cover multiple programmed states, such as multi-level cells with 2 bits and 3 levels of programming per memory location, triple level cell cells with 3 bits or 7 levels of programming per memory location.

The disclosed technology is applicable to nonvolatile memory arrays such as a NOR array and NAND array. Example nonvolatile memory elements are floating gate elements and dielectric charge trapping memory elements.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. An integrated circuit, comprising:
    a nonvolatile memory array with memory cells; and
    control circuitry performing a multi-phase erase procedure having characteristics determined by a particular mode that is one of a first erase mode and a second erase mode, the first erase mode having a shorter duration than the second erase mode of performing the multi-phase erase procedure on a block of memory cells in the nonvolatile memory array, wherein the control circuitry performs the first erase mode and the second erase mode responsive to different command codes in an erase instruction specifying an erase address, wherein the first erase mode is active during testing of the nonvolatile memory array, and the second erase mode is active after testing of the nonvolatile memory array.

2. The circuit of claim 1, wherein the multi-phase erase procedure includes an erase phase and one or more phases from a pre-program phase and a soft program phase.

3. The circuit of claim 1, wherein the first erase mode excludes a pre-program phase, and the second erase mode includes a pre-program phase.

4. The circuit of claim 1, wherein the first erase mode excludes a soft program phase, and the second erase mode includes a soft program phase.

5. The circuit of claim 1, wherein the control circuitry automatically switches repeatedly between the first erase mode and the second erase mode.

6. The circuit of claim 1, wherein the first erase mode has a shorter pulse duration than the second erase mode in a bias arrangement applied to the nonvolatile memory array, for at least one phase of the multi-phase erase procedure.

7. The circuit of claim 1, wherein the first erase mode has a larger magnitude pulse than the second erase mode in a bias arrangement applied to the nonvolatile memory array, for at least one phase of the multi-phase erase procedure.

8. The circuit of claim 1, wherein the first erase mode has a fewer number of pulses than the second erase mode in a bias arrangement applied to the nonvolatile memory array for at least one phase of the multi-phase erase procedure.

9. The circuit of claim 1, wherein in response to verify failure, the first erase mode has a larger magnitude voltage step change than the second erase mode in a bias arrangement applied to the nonvolatile memory array, for at least one phase of the multi-phase erase procedure.

10. The circuit of claim 1, further comprising a memory storing mode data read by the control circuitry to determine the particular mode of the multi-phase erase procedure.

11. A method of erasing memory cells in a nonvolatile memory array, comprising:
    receiving an erase command identifying a block of memory cells in the nonvolatile memory array, wherein the erase command has different command codes for a first erase mode and a second erase mode;
    responsive to the erase command, performing a multi-phase erase procedure having characteristics determined by a particular mode that is one of the first erase mode and the second erase mode, the first erase mode having a shorter duration than the second erase mode of performing the multi-phase erase procedure on the block of memory cells in the nonvolatile memory array;
    selecting the first erase mode for testing of the nonvolatile memory array; and
    selecting the second erase mode for after testing of the nonvolatile memory array.

12. The method of claim 11, wherein the multi-phase erase procedure includes an erase phase and one or more phases from a pre-program phase and a soft program phase.

13. The method of claim 11, wherein the first erase mode excludes a pre-program phase, and the second erase mode includes a pre-program phase.

14. The method of claim 11, wherein the first erase mode excludes a soft program phase, and the second erase mode includes a soft program phase.

15. The method of claim 11, further comprising:
    automatically switching repeatedly between the first erase mode and the second erase mode.

16. The method of claim 11, wherein the first erase mode has a shorter pulse duration than the second erase mode in a bias arrangement applied to the nonvolatile memory array, for at least one phase of the multi-phase erase procedure.

17. The method of claim 11, wherein the first erase mode has a larger magnitude pulse than the second erase mode in a bias arrangement applied to the nonvolatile memory array, for at least one phase of the multi-phase erase procedure.

18. The method of claim 11, wherein the first erase mode has a fewer number of pulses than the second erase mode in a bias arrangement applied to the nonvolatile memory array, for at least one phase of the multi-phase erase procedure.

19. The method of claim 11, wherein in response to a verify failure the first erase mode has larger magnitude voltage step change than the second erase mode in a bias arrangement applied to the nonvolatile memory array, for at least one phase of the multi-phase erase procedure.

20. The method of claim 11, wherein the multi-phase erase procedure includes a pre-program phase, an erase phase, and a soft program phase.

21. The method of claim 11, further comprising:
    reading a memory storing mode data read to determine the particular mode of the multi-phase erase procedure.

* * * * *